United States Patent [19]

Marshall et al.

[11] Patent Number: 4,588,028

[45] Date of Patent: May 13, 1986

[54] HEAT SINK AND METHOD OF MANUFACTURE

[75] Inventors: Larry D. Marshall, Dallas; Marvin F. Moore, Carrollton, both of Tex.

[73] Assignee: Thermalloy Incorporated, Dallas, Tex.

[21] Appl. No.: 730,729

[22] Filed: May 6, 1985

[51] Int. Cl.[4] .............................................. F28F 7/00
[52] U.S. Cl. .................................. 165/185; 165/80.2; 165/80.3; 357/81
[58] Field of Search .................... 165/80.1, 80.2, 80.3, 165/185; 357/81, 82; 361/381, 382, 383

[56] References Cited

U.S. PATENT DOCUMENTS

| | | | |
|---|---|---|---|
| 3,187,812 | 6/1965 | Staver | 165/80.3 X |
| 3,212,569 | 10/1965 | McAdam | 165/80.3 |
| 3,213,324 | 10/1965 | McAdam | 165/80.3 X |
| 4,054,901 | 10/1977 | Edwards et al. | 165/80.3 X |
| 4,508,163 | 4/1985 | McCarthy | 165/80.2 |

Primary Examiner—Stephen F. Husar
Attorney, Agent, or Firm—Kanz, Scherback & Timmons

[57] ABSTRACT

A heat sink is described that includes a base portion, and having a pair of heat radiating portions attached to the base portion. The heat radiating portions are each of sufficient width so that when bent along a line at roughly their midpoint, the unattached lower edges of such heat radiating portions will be disposed parallel to and in juxtaposition with the free edges of the base portion. Also, the method of manufacturing such heat sink includes, after punching the heat sinks from the sheet of material from which they are constructed, bending the heat radiating portions along the line extending generally through their midpoint and intersecting a corner of the base and then bending each of the heat radiating portions along an edge of the base to a position wherein the heat radiating portions are disposed at approximately 90 degrees to the base portion.

8 Claims, 7 Drawing Figures

HEAT SINK AND METHOD OF MANUFACTURE

BACKGROUND OF THE INVENTION

This invention relates generally to heat sinks for use in connection with printed circuit boards and the like. More particularly, but not by way of limitation, this invention relates to a heat sink that can be quickly, easily and economically constructed by mass production techniques.

Heat sinks of the type under consideration have a polygonal base portion which generally has only four sides and, on each of the sides of the base, has an upstanding heat radiating portion attached to each edge thereof. In manufacturing prior art heat sinks of this type, a substantial amount of material is lost (see FIGS. 1 and 2). As illustrated, the heat radiating portions are constructed from the same pieces of material as is the base portion. The heat radiating portions are bent along the edges of the base portion. Accordingly, all the material lying between adjacent heat radiating portions and at the outer ends of the heat radiating portions is lost in the manufacture.

An object of this invention is to provide a heat sink and method of manufacture wherein the heat radiating portions are connected to the base portion along two opposed and generally parallel sides of the base with adjacent heat radiating portions being internally formed rather than each extending from the base portion. Accordingly, substantial material saving is realized in the manufacture of such heat sinks.

SUMMARY OF THE INVENTION

This invention then, in one aspect, provides a heat sink formed from a material having high heat transfer coefficient comprising a polygonal base portion having opposed, substantially parallel edges; heat radiating means disposed at a substantially right angle to the base portion and joined to the base portion along at least one of the opposed edges; and radiating means bent along a line disposed generally perpendicular to the base portion and extending through an intersection between adjacent edges of the base portion whereby the radiating means is disposed within planes that extend through the edges and generally perpendicular to the base portion.

In another aspect this invention relates to an improved method of forming a heat sink that includes a polygonal base portion having at least two sets of generally parallel edges and having first and second heat radiating portions, each having a portion of one edge connected respectively to one of the parallel edges of the base portion. The improved method comprises the steps of bending the first heat radiating portion along a line extending through the intersection of two of the edges of the base portion; bending the second heat radiating portion along a line extending through the intersection of two other of the edges of the base portion; bending the first heat radiating portion along the connection between the base and the first heat radiating portion placing a free edge of the first heat radiating portion in generally parallel relationship to another edge of the base portion; and bending the second heat radiating portion along the connection between the base and the second heat radiating portion placing the free edge of the second heat radiating portion in generally parallel relationship to still another edge of the base portion.

BRIEF DESCRIPTION OF THE DRAWING

The foregoing and additional objects and advantages of the invention will become more apparent as the following detailed description is read in conjunction with the accompanying drawing wherein like reference characters denote like parts in all views and wherein.

DETAILED DESCRIPTION OF THE PREFERRED EMBODIMENT

Figure 1:
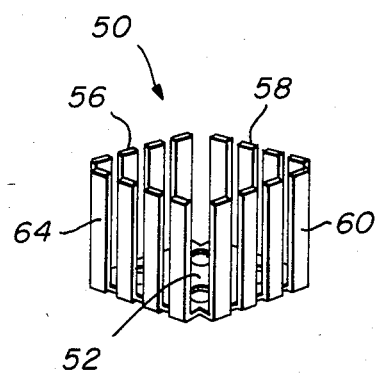
FIG. 1 is a pictorial view of a prior art heat sink.

Referring to the drawing, and to FIGS. 3-7 in particular, shown therein and generally designated by the reference character 10 is a heat sink constructed in accordance with the invention. The heat sink 10 is constructed from a material having a high coefficient of thermal conductivity and one that can be relatively easily bent into the configuration illustrated.

The heat sink 10 includes a base portion 12 having a plurality of openings 14 punched therethrough that are used for the purpose of mounting the heat sink 10 on a circuit board (not shown) and for installing a transistor or other electronic component (not shown) thereon.

The base 12 is illustrated as a polygon having four edges with opposed edges being disposed in generally parallel relationship. The edges are designated 16, 18, 20 and 22. A heat radiating portion 24 is connected along the edge 20 of the base 12 and a heat radiating portion 26 is joined along the edge 22 of the base portion 12.

The heat radiating portion 24 has a width that is equal to the length of the edge 20 plus the length of the edge 16. Similarly, the heat radiating portion 26 has a width equal to the length of the edge 22 plus the length of the edge 18.

The heat radiating portion 24 is provided with a plurality of spaced slots 28 that are arranged in the heat radiating portion 24 to provide the optimum heat transfer characteristics. Also, the heat radiating portion 26 is provided with similar slots 30 that are also provided for the purpose of providing optimum heat transfer characteristics.

Figure 5:
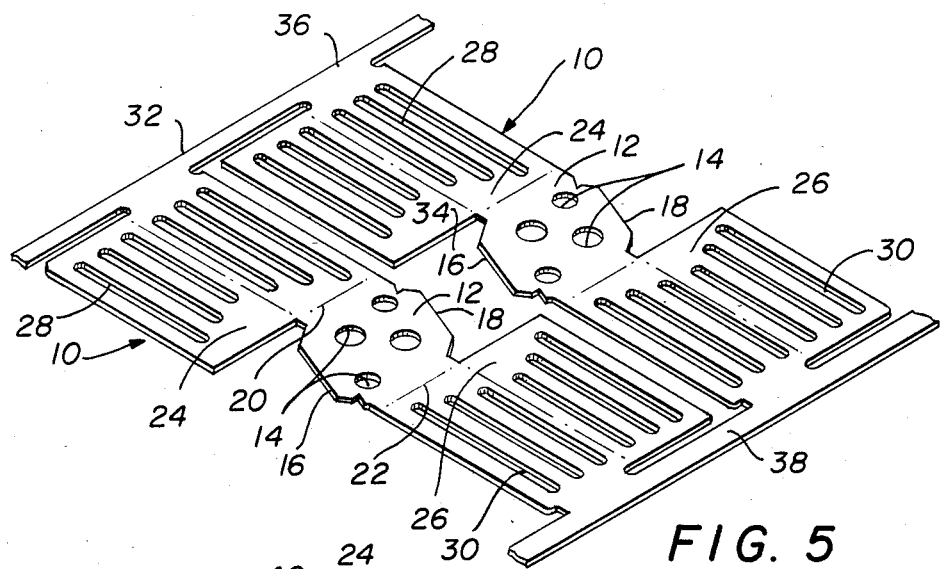
FIG. 5 is a view of the heat sink of FIG. 3 being stamped from a sheet of material prior to being bent.

FIG. 5 illustrates how the heat sinks 10 are arranged in a strip 32 of material during manufacture of the heat sinks. Due to the arrangement of the heat radiating portions 24 and 26 relative to the base portions 12, the material wasted in the manufacturing process consists essentially of the portion 34 that is cut out between the heat sinks 10 and the strips 36 and 38 which are utilized to hold the heat sinks 10 in position as they proceed through the manufacturing process.

Figure 3:
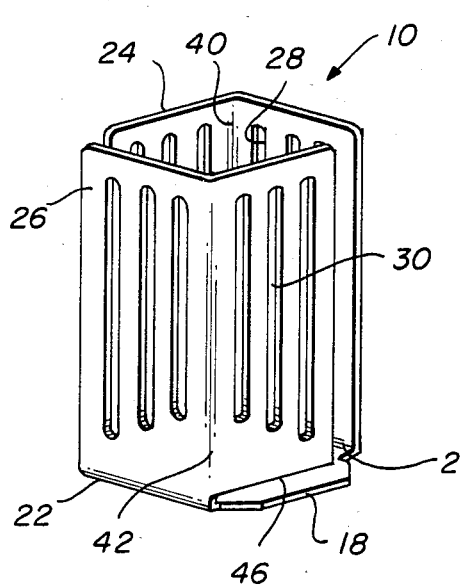
FIG. 3 is a pictorial view of a heat sink is constructed in accordance with the invention.
Figure 4:
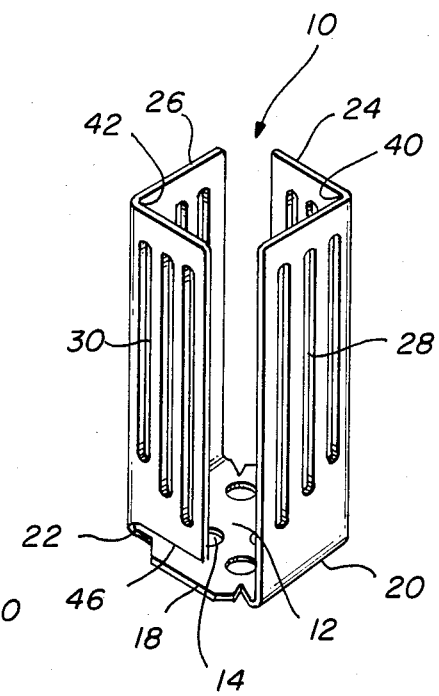
FIG. 4 a pictorial view of the heat sink of FIG. 3 rotated 90 degrees.
Figure 6:
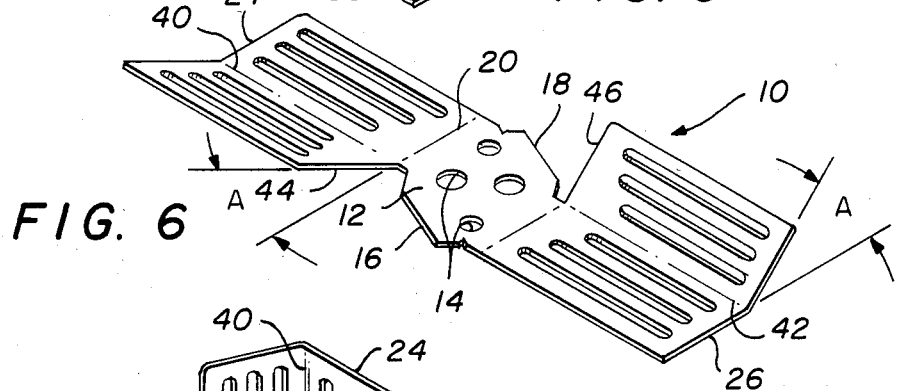
FIG. 6 is a view of the heat sink of FIG. 3 illustrating the heat sink stamped out of the sheet with a bend formed in the heat radiating portions.

During the last stages of the manufacturing process, the heat radiating portions 24 and 26 are bent along lines 40 and 42 at an angle A as illustrated in FIG. 6. It will be noted that the lines 40 and 42 generally bisect the heat radiating portions and intersect a corner of or the juncture between the sides 16 and 20 and 18 and 22, respectively. The angle A is selected so that when the heat sink is bent into its final configuration, as illustrated in FIGS. 3 and 4, the edge portions 44 and 46 on the portions 24 and 26, respectively, will lie in juxtaposition with the edges 16 and 18, respectively, of the base portion 12. While the portions 24 and 26 may be individually bent along the lines 40 and 42, a better manufacturing technique is to make the bends simultaneously.

Figure 7:
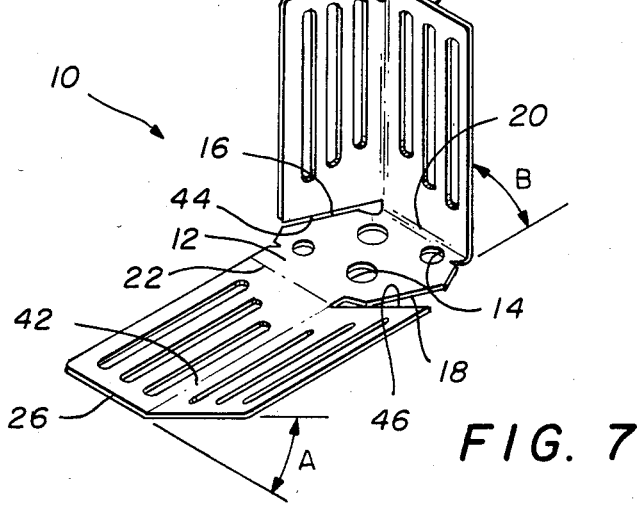
FIG. 7 is another view of the heat sink of FIG. 3 with a bend formed between one of the heat radiating portions and the base portion.

FIG. 7 illustrates the heat sink 10 after the heat radiating portion 24 has been bent along the edge 20 of the base portion 12 to the angle B. The angle B is, in the preferred form, a right angle. Thus, the heat radiating portion 24 is disposed perpendicularly with respect to the plane of the base portion 12. Again, a better manufacturing technique is to bend the portion 26 along the edge 22 simultaneously with the bending of the heat radiating portion 24. After the bends have been completed, the heat sink 10 will be configured as illustrated in FIGS. 3 and 4.

Figure 2:
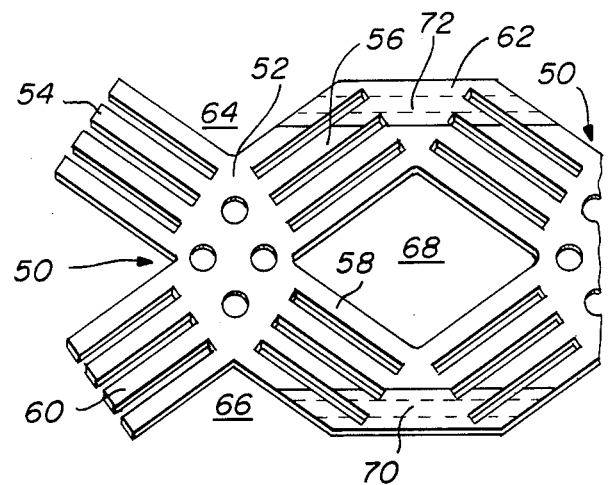
FIG. 2 is a view of the heat sink of FIG. 1 in a strip of heat sinks before bending.

A comparison of the heat sink 10 to the prior constructed heat sink designated by the reference character 50 in FIGS. 1 and 2 clearly illustrates the advantages of the technique utilized to manufacture the heat sink 10. As shown therein, the heat sink 50 includes a base portion 52 and heat radiating portions 54, 56, 58 and 60 that are in the final form of the heat sink 50, bent at substantially right angles to the base 52.

As shown in FIG. 2, the heat sinks 50 are shown in the sheet 62 to illustrate the amount of material lost when utilizing the manufacturing procedure followed when constructing the prior art heat sinks 50. As shown therein, areas 64, 66, 68, 70 and 72 are punched out and lost each time a heat sink is constructed. While this may not appear to be a significant amount of material as compared to the area 34 lost when utilizing the procedure of the invention, it should be remembered that generally thousands of the heat sinks are constructed in a high speed process, thus the difference between the materials lost in the two procedures must be multiplied accordingly. The material utilized is relatively expensive and the market is highly competitive. Thus, even a small saving in the loss of material becomes very significant in the price of the finished product.

The single embodiment of the heat sink described hereinbefore can be manufactured by mass production techniques effectively and efficiently at a substantial cost saving over the prior art heat sinks. At the same time there is little, if any, loss in the operating efficiency of the heat sink constructed by the described technique as compared to the prior art heat sinks.

It will be understood that the embodiment described in detail herein is presented by way of example only and that many changes and modifications can be made thereto without departing from the spirit or scope of the invention.

What is claimed is:

1. A heat sink formed from a material having a high heat transfer coefficient comprising:
    a polygonal base portion having opposed, substantially parallel edges;
    heat radiating means disposed at a substantially right angle to said base portion and joined to said base portion along at least one of said opposed edges; and
    said radiating means being bent along a line disposed generally perpendicularly to said base portion and extending through an intersection between adjacent edges of said base portion whereby said radiating means is disposed within planes extending through said edges and generally perpendicularly to said base portion.

2. The heat sink of claim 1 wherein
    said base portion is a parallelogram and
    said heat radiating means includes two heat radiating portions joined to opposite edge of said base portion.

3. The heat sink of claim 2 wherein each said radiating portion has a plurality of elongated slots extending therethrough.

4. The heat sink of claim 3 wherein said slots extend perpendicular to said base and do not extend through any edge of said heat radiating portions.

5. An improved method of forming a heat sink including a polygonal base portion having two sets of generally parallel edges and having first and second heat radiating portions each having a portion of one edge connected respectively to one of the parallel edges of said base portion; said improved method comprising the steps of:
    bending said first heat radiating portion along a line extending through the intersection of two of the edges of said base portion;
    bending said second heat radiating portion along a line extending through the intersection of two other of the edges of said base portion;
    bending said first heat radiating portion along the connection between the base and said first heat radiating portion placing a free edge of said first heat radiating portion in generally parallel relationship to another edge of said base portion; and
    bending said second heat radiating portion along the connection between the base and said second heat radiating portion placing a free edge of said second heat radiating portion in generally parallel relationship to still another edge of said base portion.

6. The improved method of claim 5 wherein the first and second mentioned bending steps occur simultaneously.

7. The improved method of claim 5 wherein the third and fourth mentioned bending steps occur simultaneously.

8. The improved method of claim 6 wherein the third and fourth mentioned bending steps occur simultaneously after the simultaneous occurrence of the first and second bending steps.

* * * * *

UNITED STATES PATENT AND TRADEMARK OFFICE
CERTIFICATE OF CORRECTION

PATENT NO. : 4,588,028
DATED : May 13, 1986
INVENTOR(S) : Larry D. Marshall and Marvin F. Moore It is certified that error appears in the above-identified patent and that said Letters Patent is hereby corrected as shown below:

In Column 2, line 13, delete "is" (second occurrence)

In Column 2, line 15, after "Fig. 4" insert "is"

Signed and Sealed this

Twelfth Day of August 1986

[SEAL]

Attest:

DONALD J. QUIGG

Attesting Officer   Commissioner of Patents and Trademarks